(12) United States Patent
Miyata

(10) Patent No.: US 9,366,393 B2
(45) Date of Patent: Jun. 14, 2016

(54) LIGHT EMITTING DEVICE

(71) Applicant: NICHIA CORPORATION, Anan-shi, Tokushima (JP)

(72) Inventor: Tadaaki Miyata, Yokohama (JP)

(73) Assignee: NICHIA CORPORATION, Anan-shi (JP)

( * ) Notice: Subject to any disclaimer, the term of this patent is extended or adjusted under 35 U.S.C. 154(b) by 186 days.

(21) Appl. No.: 14/137,080

(22) Filed: Dec. 20, 2013

(65) Prior Publication Data
US 2014/0185294 A1   Jul. 3, 2014

(30) Foreign Application Priority Data

Dec. 28, 2012   (JP) .................................. 2012-288984

(51) Int. Cl.
| F21S 4/00 | (2006.01) |
| F21V 21/00 | (2006.01) |
| F21K 99/00 | (2016.01) |
| F21V 19/00 | (2006.01) |
| F21V 23/00 | (2015.01) |

(52) U.S. Cl.
CPC ................. *F21K 9/30* (2013.01); *F21V 19/003* (2013.01); *F21V 23/004* (2013.01); *F21V 23/006* (2013.01)

(58) Field of Classification Search
CPC ....... F21K 9/30; F21V 23/006; F21V 23/004; F21V 19/003; F21V 19/001; F21V 23/001

USPC ............. 362/249.02, 249.04, 249.06, 249.08, 362/391, 249.01; 257/88, 99; 313/498, 505
See application file for complete search history.

(56) References Cited

U.S. PATENT DOCUMENTS

| 2003/0052594 | A1 | 3/2003 | Matsui et al. |
| 2003/0072153 | A1 | 4/2003 | Matsui et al. |
| 2005/0247944 | A1 | 11/2005 | Haque et al. |
| 2008/0093606 | A1* | 4/2008 | Pan .................... H01L 24/97 257/81 |
| 2013/0001633 | A1* | 1/2013 | Imai .................... H01L 33/60 257/99 |
| 2014/0084781 | A1* | 3/2014 | Tamura ............ H01L 33/502 313/501 |

FOREIGN PATENT DOCUMENTS

| JP | 2003-092010 A | 3/2003 |
| JP | 2003-092011 A | 3/2003 |
| JP | 2005-322937 A | 11/2005 |

* cited by examiner

*Primary Examiner* — Elmito Breval
*Assistant Examiner* — Glenn Zimmerman
(74) *Attorney, Agent, or Firm* — Global IP Counselors, LLP

(57) ABSTRACT

In a light emitting device, one of at least one reinforcing portion is disposed on a site for joining regions of two wiring portions. The site for joining regions is provided for at least a first joining region where the first groove portion and the third groove portion join, and a second joining region where the second groove portion and the third groove portion join. A light emitting element is disposed over the third groove portion. In a plan view of the substrate member, the reinforcing portion surrounds the light emitting element. The upper surface of the reinforcing portion is lower than the upper surface of the light emitting element.

20 Claims, 5 Drawing Sheets

LIGHT EMITTING DEVICE

This application claims priority to Japanese Patent Application No. 2012-288984 filed on Dec. 28, 2012. The entire disclosure of Japanese Patent Application No. 2012-202952 is hereby incorporated herein by reference.

BACKGROUND OF THE INVENTION

1. Technical Field

The present disclosure relates to a light emitting device which includes a substrate member and at least one light emitting element.

2. Background Art

There has been proposed a light emitting device which includes a light emitting element arranged on a flexible substrate member (see Patent Literature 1: JP2005-322937A). The light emitting device described in Patent Literature 1: JP2005-322937A can be rolled up during the transportation, and also can be cut in a desired size for use.

However, in the light emitting device described in the Patent Literature 1 JP2005-322937A, there is a problem in that, for example, when the light emitting device is rolled-up, concentration of stress is tend to be experienced between the light emitting element and the substrate.

SUMMARY OF THE INVENTION

The present invention is devised in the light of such circumstances, and it is hence an object thereof to provide a light emitting device in which stress experienced on the light emitting element and the substrate member can be reduced.

A light emitting device according to an aspect of the present invention includes a substrate member and at least one light emitting element. The substrate member includes a flexible base member, a plurality of wiring portions disposed on the base member, at least one reinforcing portions disposed on corresponding portions of the plurality of wiring portions, and a groove portion formed by spacing the plurality of wiring portions apart from each other. The at least one light emitting element is disposed on the substrate member. The groove portion includes at least one first groove part, at least one second groove part, and at least one third groove part. The at least one first groove part extends in a first direction. The at least one second groove part is spaced apart from corresponding one of the first groove part and extends in a second direction. The at least one third groove part is connected to corresponding one of the at least one first groove part and corresponding one of the at least one second groove part, and extends in a third direction which is different from the first direction and the second direction. The at least one light emitting element is disposed over corresponding one of at least one third groove part. The at least one reinforcing portion is disposed, among the plurality of wiring portions, on a site for joining regions provided for at least a first joining region where the first groove portion and the third groove portion are joined, and a second joining region where the second groove portion and the third groove portion are joined. In a plan view of the substrate member, the at least one reinforcing portion each surrounds the corresponding one of the at least one light emitting element. The upper surface of the at least one reinforcing portion is located lower than the upper surface of the corresponding at least one of the light emitting element.

The present invention can provide a light emitting device in which a stress experienced on the at least one light emitting element and the substrate member can be reduced.

DETAILED DESCRIPTION

Next, embodiments of the invention will be described with reference to the drawings. In the description of the drawings below, the same or similar components are denoted by the same or similar reference symbols. However, it should be noted that the drawings are drawn schematically, and the dimensional ratios and the like of the components may differ from the actual ratios. Accordingly, the specific dimension and the like should be determined in consideration of the description below. In addition, the drawings may also include the components that have different dimensional relations and ratios among one another.

Structure of Light Emitting Device 100

Figure 1:
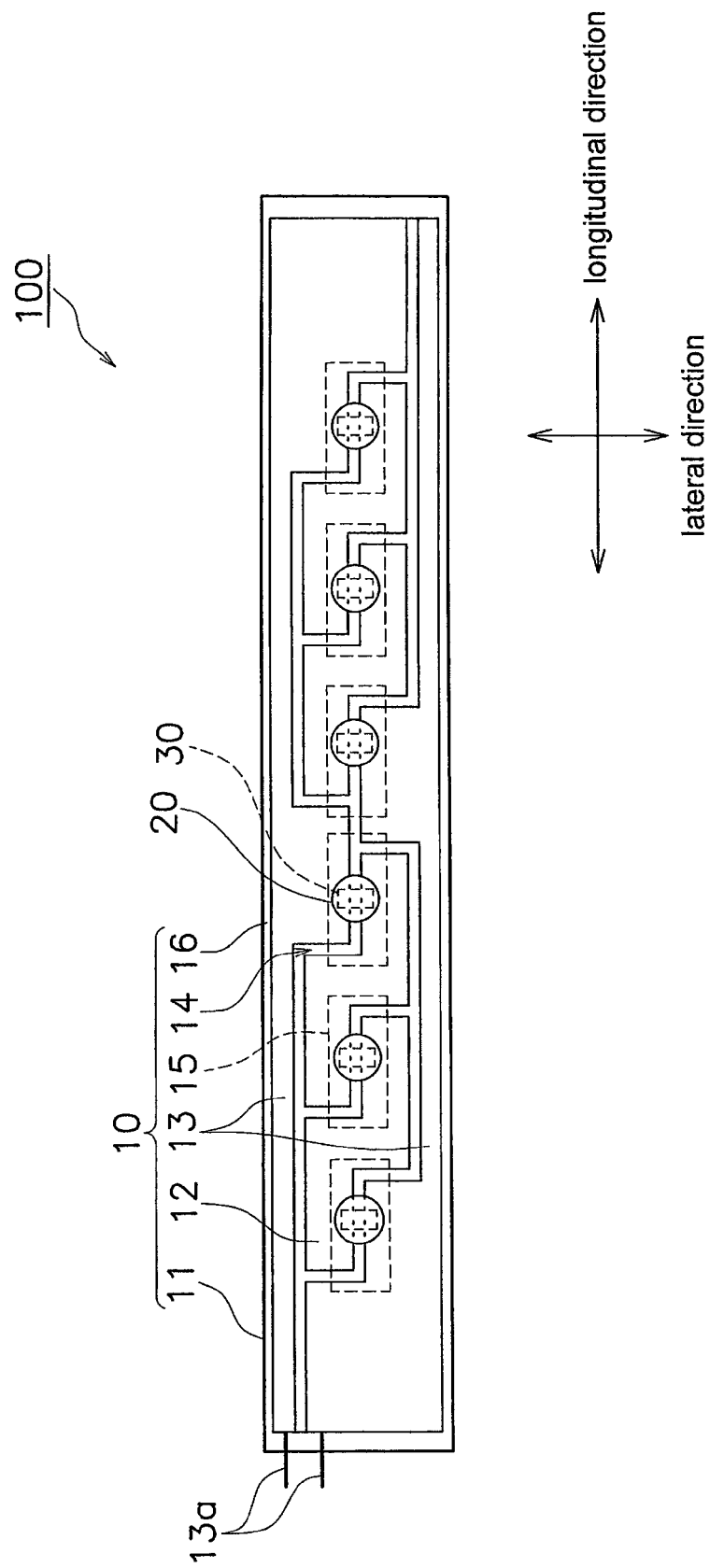
FIG. 1 is a schematic plan view of a light emitting device.
Figure 2:
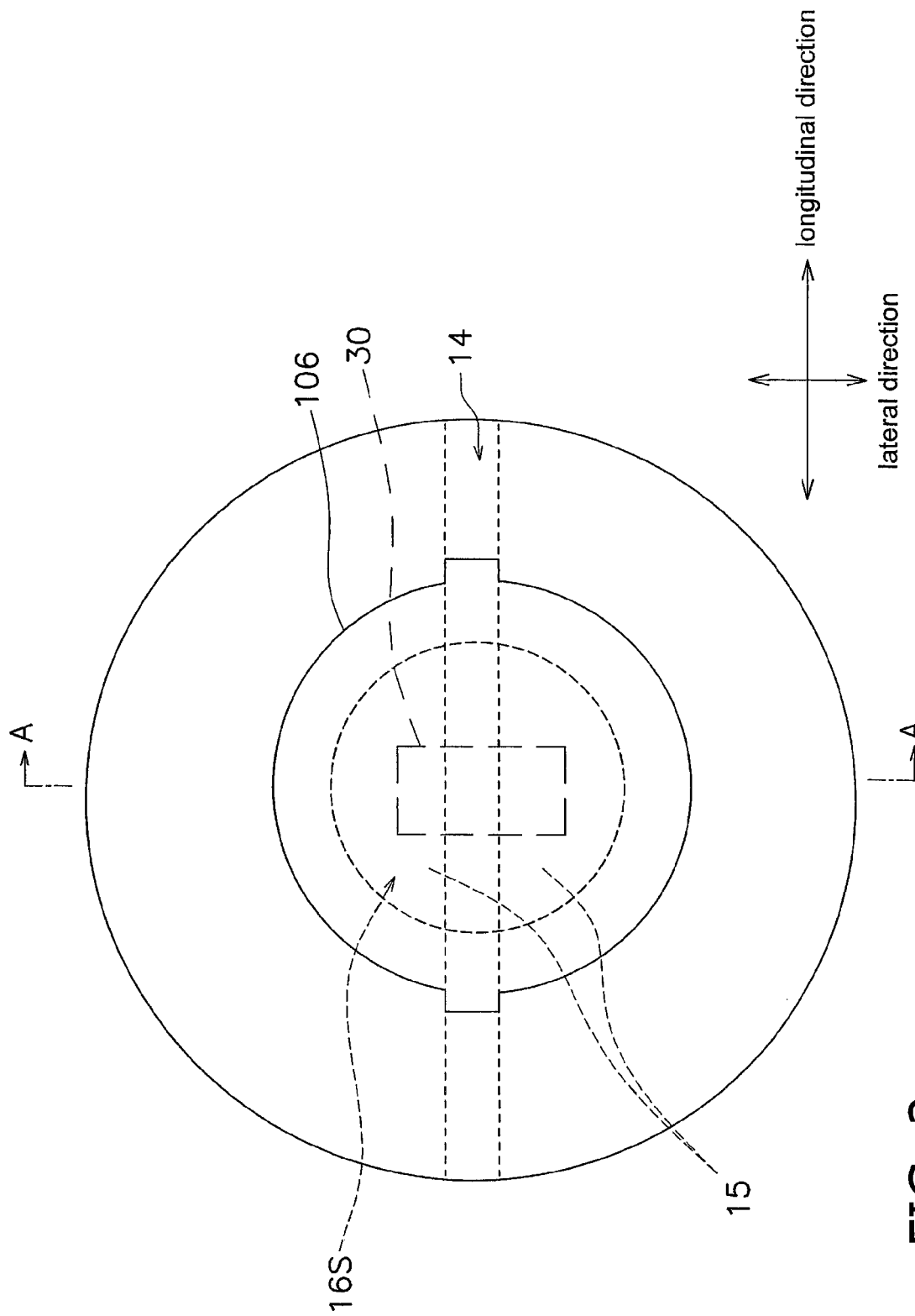
FIG. 2 is an enlarged plan view of a sealing member.
Figure 3:
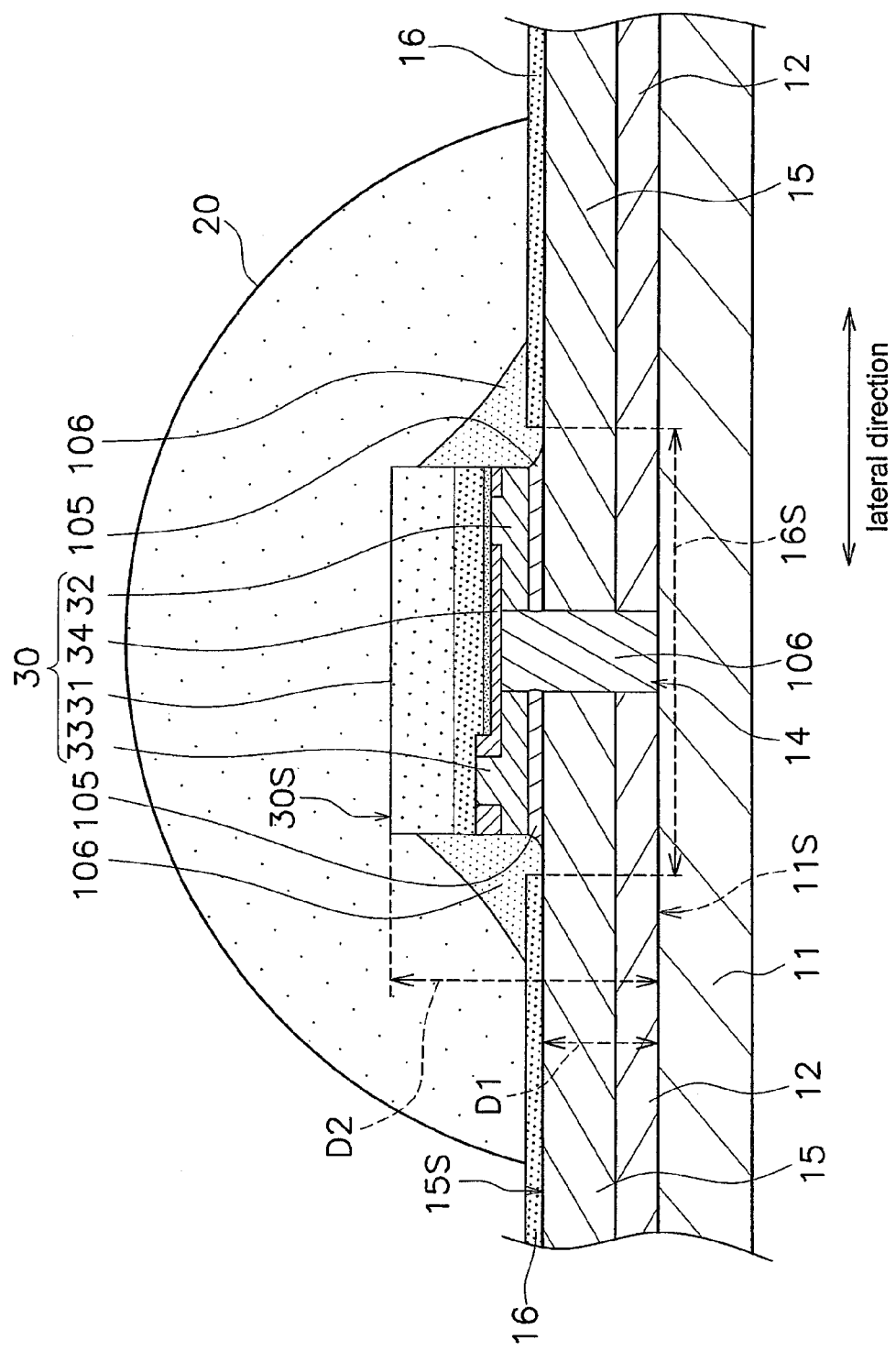
FIG. 3 is a cross sectional view taken along line A-A of FIG. 2.

A structure of a light emitting device 100 according to an embodiment will be described with reference to the drawings. FIG. 1 is a plan view showing a structure of a light emitting device 100. FIG. 2 shows an enlarged plan view of a sealing member 20. FIG. 3 is a cross sectional view taken along line A-A of FIG. 2. In the description below, the term such as "upper" and "over" refers a side in the thickness direction of the light emitting device 100 to which light is emitted, and the term such as "lower" and "below" refers to a side in the thickness direction of the light emitting device 100 opposite side from the "upper" side.

The light emitting device 100 according to the present embodiment includes a substrate member 10, six sealing members 20, and six light emitting elements 30. The light emitting device 100 is flexible, so that it can be stored rolled-up on a reel etc., and can be installed along a curved surface.

1. Structure of Substrate Member 10

The substrate member 10 of the present embodiment is a flexible elongated member. The ratio of the lengths of the substrate member 10 in the longitudinal direction and the lateral direction can be appropriately adjusted, for example, to be 6:1, 30:1, or 100:1. The length of the substrate member 10 in the longitudinal direction can be 400 to 1200 mm, and the length of the substrate member 10 in the lateral direction can be 5 to 30 mm, for example. The substrate member 10 includes a flexible base member 11, four wiring portions 12, two terminal portions 13, a groove portion 14, six reinforcing portion 15, and a reflective layer 16 (a reflecting coating), for example.

The base member 11 can be made of a flexible insulating material. For such a material, an insulating resin such as polyimide, polyethylene terephthalate and polyethylene naphthalate can be preferably used but is not limited thereto. For example, the base member 11 may be made of a strip of copper foil or aluminum foil which is covered with an insulating resin. The base member 11 can have a thickness of about 10 μm to about 200 μm, for example. The material of the base member 11 can be appropriately selected in view of the type of mounting of the light emitting elements 30, the reflectance, and adhesion with other members, etc. For example, in the case where a solder is used for mounting the light emitting elements 30, a polyimide which has a high heat resistance may be preferably used, and in the case where the reflective layer 16, which will be described later, is not disposed on the base member 11 (that is, the base member 11 is exposed toward the upper side of the light emitting device), a material which has a high optical reflectance (for example a white color material) may be preferably used. For electrical insulation, an insulating resist is preferably disposed on the base member 11, the wiring portions 12 to be described below, and the terminal portions 13 etc.

The four wiring portions 12 are arranged on a main surface of the base member 11. The four wiring portions 12 are arranged between the two terminal portions 13. The four wiring portions 12 are placed along the first direction. The four wiring portions 12 are arranged spaced apart from each other. The four wiring portions 12 are spaced apart from the two terminal portions 13. With this arrangement, the groove portion 14 is formed between the wiring portions 12, between the wiring portions 12 and their adjacent terminal portions 13, and between the terminal portions 13, respectively. Such wiring portions 12 are formed with, for example, a thin metal film such as a copper foil or an aluminum foil, or an electrically conductive paste or an electrically conductive ink such as a silver paste. Also, a thin layer of gold, nickel, or tin etc., may be disposed on the wiring portions by way of plating etc. The wiring portions 12 have a thickness which does not impair the flexibility of the substrate member 10 and a thickness of 8 µm to 150 µm is preferable. The wiring portions 12 are preferably arranged on an upper surface 11S of the base member 11 respectively with a largest possible area. An increase in the surface area of the wiring portions 12 allows for increased heat dissipation from the wiring portions 12. Also, in a plan view, the corners of the wiring portions 12 are preferably rounded. The corners are preferably rounded with a radius of 100 µm or more.

The two terminal portions 13 are arranged on the main surface which is the upper surface 11S of the base member 11. The two terminal portions 13 extend in the longitudinal direction at the both sides in the lateral direction of the base member 11. As described above, the two terminal portions 13 are spaced apart from the four wiring portions 12 to form a part of the groove portion 14. Also, a part of the groove portion 14 is also formed between the two terminal portions 13 such that the two terminal portions 13 are spaced apart from each other. Each of the two terminal portions 13 is connected with one of a pair of external wirings 13a. The external wirings 13a can be connected to conventional connectors disposed on the substrate member 10.

The two terminal portions 13 in addition to the wiring portions 12 can increase the freedom of arrangement of the light emitting elements 30. For example, it becomes possible that six light emitting elements 30 are arranged three in the longitudinal direction and two in the lateral direction as one block and connected in parallel, then, twelve blocks are arranged in the longitudinal direction and connected in series by a pair of terminal portions 13. The two terminal portions 13 are at least made up of a positive-side terminal portion and a negative-side terminal portion and the number of the terminals constituting each of the two terminal portions 13 is not specifically limited. That is, each of the two terminal portions 13 may be made up of a single terminal or may be made up of a plurality of terminals.

The groove portion 14 is defined on the base member 11, between the wiring portions 12, between the terminal portions 13, and between the respective the wiring portion 12 and the terminal portion 13. The groove portions 14 may be formed in a crank shape in a plan view, as shown in FIG. 1. The width of the groove portion 14 is preferably narrower than the width of the wiring portions 12. More specifically, the interval of the groove portions 14 can be, for example, about 0.05 mm to about 5 mm. The configuration of the groove portions 14 will be described later.

The six reinforcing portions 15 are arranged on corresponding portions of a total of four wiring portions and two terminal portions 13 respectively. As shown in FIG. 1, the six reinforcing portions 15 are disposed bridging a wiring portion 12 and one or two terminal portions 13, or bridging two wiring portions 12. The reinforcing portions 15 preferably have higher mechanical strength than the base member 11, the wiring portions 12, and the terminal portions 13. The reinforcing portions 15 can be made of aluminum or copper, but is not limited thereto. The material of the reinforcing portions 15 may have either electrically conductive property or insulating property. The material of the reinforcing portions 15 may be the same material used in the wiring portions 12 but has higher mechanical strength by employing a different thickness or processing technique. Also, the reinforcing portion 15 preferably has a higher hardness than the base member 11, the wiring portions 12, and the terminal portions 13. In the case where flexibility is required to the light emitting device, the material, the planar dimension, the position, the mechanical strength, or the like, of the reinforcing portions 15 can be appropriately adjusted according to the requirements. Next, the construction of the reinforcing portion 15 will be described.

An upper surface 15S of the reinforcing portion 15 is lower than the upper surface 30S of the light emitting element 30. More specifically, as shown in FIG. 3, the distance D1 between the upper surface 15S of the reinforcing portion 15 and the upper surface 11S of the base member 11 is smaller than the distance D2 between the upper surface 30S of the light emitting element 30 and the upper surface 11S of the base member 11. That is, the upper surface 15S of the reinforcing member 15 is arranged at a position closer to the upper surface 11S of the base member 11 compared to the position of the upper surface 30S of the light emitting element 30 with respect to the upper surface 11S of the base member 11. Further, the upper surface 15S of the reinforcing member 15 is preferably arranged at a position closer to the upper surface 11S of the base member 11 compared to the position of the active layer of the light emitting element 30 to the upper surface 11S of the base member 11. The upper surface 15S of the reinforcing portion 15 is preferably lower than the active layer of the light emitting element 30. With this arrangement, light emitted from the active layer of the light emitting element 30 can be further prevented from being blocked by the reinforcing portion 15.

In the present embodiment, the reflective layer 16 covers the base member 11, four wiring portions 12, two terminal portions 13, and the six reinforcing portions 15. The reflective layer 16 also covers the inner surfaces of the groove portion 14. Thus, the reflective layer 16 covers approximately the entire upper surface of the substrate 10 except for the opening portions 16S to be described below. Such a reflective layer 16 is made of a material which can reflect the emitted light (including the wavelength-converted light by a wavelength converting member) from the at least one light emitting element 30. For such a material, an insulating white material which is a so-called white resist made of a silicone-based resin containing titanium oxide, silicon oxide, barium sulfate, aluminum oxide, or the like, is preferably used but is not limited thereto.

Also, six openings 16S are defined in the reflective layer 16 for disposing the six light emitting elements 30 respectively. FIG. 2 and FIG. 3 each shows an opening 16S configured to expose a part of the reinforcing portion 15 is shown.

2. Structure of Sealing Member 20

In the present embodiment, six sealing members 20 are arranged on the substrate member 10. The six sealing members 20 are preferably arranged to cover the six openings 16S defined in the reflective layer 16, that is, arranged so that the wirings in the openings are nor exposed to outside of the light emitting device. The six sealing portions 20 can be placed in the longitudinal direction. The six sealing members 20 seal the six light emitting elements 30 respectively. The sealing members 20 are, as shown in FIG. 3, respectively formed in a hemisphere shape with one light emitting element 30 at the center, but is not limited thereto.

Such sealing members 20 are made up of a light transmissive resin (for example, an epoxy resin, a urea resin, a silicone resin, a modified-type of such a resin, etc.). The sealing members 20 may contain a light-scattering agent (barium sulfate, titanium oxide, aluminum oxide, silicon oxide, etc).

The sealing members 20 preferably contains a wavelength converting member which can absorb emission from the light emitting elements 30 and emits light of different wavelength. Examples of such a wavelength converting member include an oxide-based fluorescent material, a sulfide-based fluorescent material, and a nitride-based fluorescent material. It is preferable that, particularly with the use of a gallium nitride based light emitting element to emit blue light as the light emitting elements 30, a fluorescent material to absorb blue light, such as a YAG-based fluorescent material or a LAG-based fluorescent material to emit yellow to green light, a SiAlON-based fluorescent material to emit green light, and a SCASN-based fluorescent material and a CASN-based fluorescent material to emit red light, are preferably used singly or in combination.

More specifically, for the light emitting devices used for the display devices such as backlights of liquid crystal displays and TV-screens, a SiAlON-based fluorescent material and a SCASN-based fluorescent material are preferably used singly or in combination. Also, in a light emitting device for lighting applications, a YAG-based fluorescent material or a LAG-based fluorescent material and a SCASN-based fluorescent material or a CASN-based fluorescent material are preferably used in combination.

3. Structure of Light Emitting Element

In the present embodiment, the six light emitting elements 30 are arranged on the substrate member 10. The six light emitting elements 30 are respectively disposed in the six openings 16S formed in the reflective layer 16. The six light emitting elements 30 are placed in the longitudinal direction. The six light emitting elements 30 include two light emitting elements connected to two wiring portions 12 and four light emitting elements connected to one wiring portion 12 and one terminal portion 13. As shown in FIG. 2, the light emitting element 30 has a rectangular planar shape. A part of the groove portion 14 is formed extending in the longitudinal direction of the substrate member and the light emitting element 30 is disposed in a direction to bridge over the groove portion 14.

In the embodiment, each of the six light emitting elements 30 is, as shown in FIG. 3, mounted on the substrate member 10 in a flip-chip manner. Each light emitting element 30 is connected to a pair of sections of the wiring portion 12 via a pair of bonding members 105 respectively. The bonding member 105 can be made of, for example, a solder such as a Sn—Ag—Cu based solder, an Au—Sn based solder, a Sn—Cu based solder, or a Sn—Bi based solder, a metal such as Au, an anisotropic conductive paste, or an Ag paste. The substrate 105 may have a thickness of about 1 μm to about 50 μm. An underfill material 106 is filled between each light emitting element 30 and the base member 11, if necessary. The underfill material 106 is, as shown in FIG. 2 and FIG. 3, preferably disposed not only on the reinforcing portions 15 but also on the upper surface of the reflective layer 16. With this arrangement, the light extraction efficiency can be enhanced and also the light emitting elements 30 can be supported firmly. The underfill material 106 can be made of, for example, a silicone resin or an epoxy resin, a fluororesin, or a hybrid resin containing one or more those resins. The underfill material 106 preferably has a light reflecting property by containing barium sulfate, titanium oxide, aluminum oxide, or silicon oxide, etc., which has a white color. Also, the underfill material 106 may contain a wavelength-converting member as described above.

Also, the light emitting elements 30 respectively include a semiconductor structure 31, a p-side electrode 32, an n-side electrode 33, and an insulating layer 34, as shown in FIG. 3. The semiconductor structure 31 includes an n-type layer, an active layer, and a p-type layer which are stacked in the order on a light-transmissive sapphire substrate. The n-type layer, the active layer and the p-type layers can be respectively made of, for example, a gallium nitride-based semiconductor. The p-side electrode 32 and the n-side electrode 33 are respectively connected to a pair of sections of the wiring portion 12 via a pair of bonding members 105. The n-side electrode 33 extends to a lower portion of the p-type layer via the insulating material layer 34. With a structure as described above in which the insulating layer 34 overlaps the p-side electrode 32 and the n-side electrode 33, the strength of the light emitting element can be increased, so that a light emitting device having higher tolerance for bending can be obtained. The light emitting element 30 may have a height of about 5 μm to about 200 μm.

Further, a light emitting element that does not contain a substrate such as a sapphire substrate (i.e. a light emitting element constituted with a semiconductor layer, electrodes, an insulating layer, and the like) can also be employed as the light emitting element 30. For example, after mounting the light emitting element 30 on the substrate member 10 by using a pair of joining members, the sapphire substrate can be removed by using laser lift-off technique. In such a case, elimination of substrate in the light emitting element allows an improvement in the optical output power from the light emitting element, but at the same time, the mechanical strength of the light emitting element decreases. Thus, the reinforcing portion 15 (described below) is provided to improve the mechanical strength of the light emitting diode.

Groove Portion 14 and Reinforcing Portion 15

Figure 4:
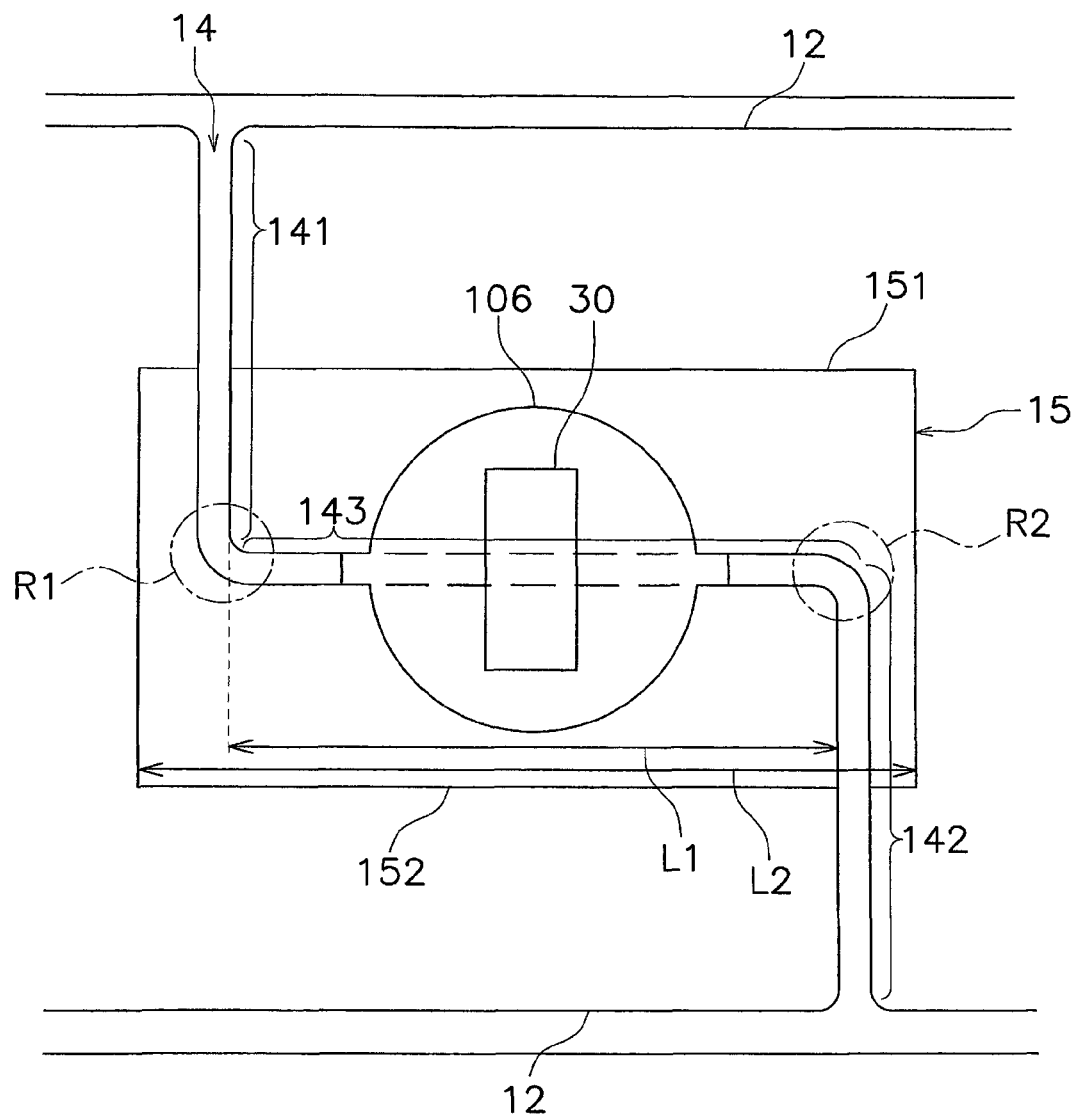
FIG. 4 is a partially enlarged view of FIG. 1.
Figure 5:
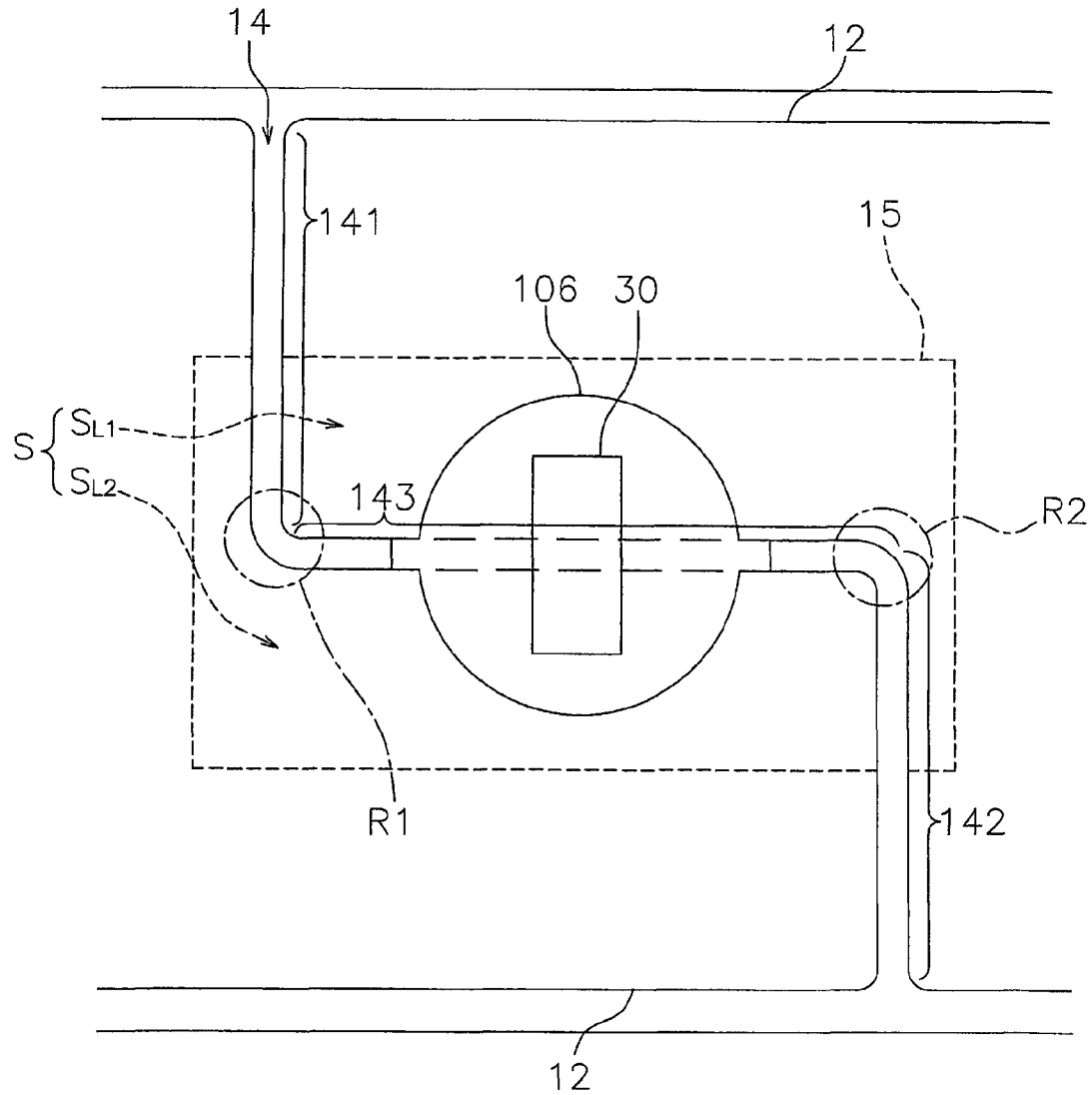
FIG. 5 is a partially enlarged view of FIG. 1.

Next, the configuration of the groove portion 14 and the reinforcing portion 15 will be described with reference to the drawings. FIG. 4 and FIG. 5 each shows a partially enlarged view of FIG. 1. In FIG. 4 and FIG. 5, for the sake of illustration of the configuration of the groove portion 14 and the reinforcing portion 15, the reflective layer 16 and the sealing member 20 are omitted. Also, in FIG. 5, for the sake of illustration of the configuration of the wiring portion 12, the reinforcing portion 15 is omitted.

The groove portion 14 includes a first groove part 141, a second groove part 142, and a third groove part 143. The first groove part 141 extends along the lateral direction (i.e. an example of the first direction). The second groove part 142 extends along the lateral direction (i.e. an example of the second direction). Accordingly, in the present embodiment, the second groove part 142 is substantially in parallel to the first groove part 141. The second groove part 142 is spaced apart from the first groove part 141 in the lateral direction. The second groove part 142 is spaced apart from the first groove part 141 in the longitudinal direction to the amount of interval L1. A third groove part 143 is joined to a first groove part 141 and a second groove part 142. More specifically, the first groove part 141 and the third groove part 143 are joined in the first joining region R1, and the second groove part 142 and the third groove part 143 are joined in the second joining region R2. The third groove part 143 extends along the longitudinal direction (i.e. an example of the third direction). Thus, the third groove part 143 is angled with respect to the first groove part 141 and the second groove part 142 respectively. The light emitting element 30 is disposed over the third groove part 143.

For example, as shown in FIG. 5, the reinforcing portion 15 is arranged on the two wiring portions 12. A site for joining regions S which is provided for at least a first joining region R1 and a second joining region R2 is arranged on two adjacent terminal portions 13. The site for joining regions S includes a first L-shape section $S_{L1}$ and a second L-shape section $S_{L2}$ which are adjacent with each other interposing the groove portion 14. The first L-shape section $S_{L1}$ and the second L-shape section $S_{L2}$ are respectively a part of the two wiring portions 12 which are adjacent with each other interposing the groove portion 14. The first L-shape section $S_{L1}$ and the second L-shape section $S_{L2}$ are respectively disposed in an L-shape along the groove portion 14. As shown in FIG. 4, the reinforcing portion 15 is disposed on the site for joining regions S on the two wiring portions 12. The reinforcing portion 15 includes a first section 151 disposed on the first L-shape section $S_{L1}$ and a second section 152 disposed on the second L-shape section $S_{L2}$.

In a plan view of the substrate member 10, the reinforcing portion 15 surrounds the circumference of the light emitting element 30. That is, in the longitudinal direction, the width L2 of the outer edge at the both sides of the reinforcing portion 15 is larger than the interval L1 between the first groove part 141 and the second groove part 142. Also, in the lateral direction, the outer edge at the both sides of the reinforcing portion 15 is preferably larger than the width of the joining portion of the light emitting element 30.

The reinforcing portion 15 can be disposed by, for example, plating or attaching a metal foil. The reinforcing portion 15 may be formed by plating a thin metal of relatively hard metal such as nickel, chrome, or titanium, or by plating a thick metal of soft metal such as copper or aluminum. Further, a foil of such as iron or stainless may be attached to use as the reinforcing portion 15. In the case where the reinforcing portion 15 is disposed on the upper surface of the wiring portion 12, that is the surface of the wiring portion 12 at a side where the light emitting elements 30 are mounted, a material having a higher hardness (for example, nickel, chrome, or titanium) than the wiring portion 12 is preferably plated on the upper surface of the wiring portion 12. With this, the reinforcing portions 15 can be arranged at any appropriate locations, and further, in the case where the reinforcing portions are arranged at the junction part of the light emitting elements 30, electrical connection can be obtained. The material of the reinforcing portion 15 is not limited to that described above, and in the case where an electrical connection is not required, a rigid insulating member (for example, a hard-plastic, glass, ceramics) may be employed. Also, a material having high electrical conductivity or heat releasing property (for example, copper) can be used as the wiring portion 12, and disposing the reinforcing portion 15 on the wiring portion 12 allows good performance and mechanical strength of the light emitting device. The thickness of the reinforcing portions can be adjusted according to the material to be used and thus is not specifically limited, and for example, a thickness of, for example, 0.1 µm to 100 µm, or 3 µm to 50 µm can be employed.

The reinforcing portion 15 is to add to the strength against an external force, so that the reinforcing portion 15 can be arranged not only on the upper surface of the wiring portion 12 but also on the lower surface of the substrate member 10. For example, attaching of a metal plate on the entire portion of the reinforcing portion 15 disposed on the back-surface of the substrate member 10 can improve the strength against an external force such as bending, and also can improve the heat dissipating property.

Also, the shape of the reinforcing portion 15 is not specifically limited, but is configured to allow a part of the reinforcing portion 15 around the third groove part 143 defined in the vicinity of the joining portion of the light emitting element 10 to have higher mechanical strength than the portions not to be provided with the reinforcing portions. Accordingly, the shape and the material to be used, and the thickness of the reinforcing portions 15 can be selected. That is, the third groove part 143 to where the light emitting element 10 is disposed over has a lower bending strength than the portion does not have a groove, so that when the bending stress is experienced, the stress tends to concentrate on the weak portion, which may result in breakage of the joining portion of the light emitting element. Thus, reinforcing the third groove part 143 with the reinforcing portion 15 allows dispersion of stress experienced on the joining portion of the light emitting element, so that breakage of the joining portion due to bending can be prevented.

The light emitting device 100 as described above employs the flexible substrate member 10, so that a roll-to-roll processing method can be used for manufacturing.

Performance and Effects

In the light emitting device 100, at least one reinforcing portion 15 is disposed on each of at least one site for joining region S located on two wiring portions 12. A site for joining region S includes a first joining region R1 where the first groove part 141 and the third groove part 143 join, and a second joining region R2 where the second groove part 142 and the third groove part 143 join. The at least one light emitting element 30 is disposed over the third groove portion 143. In a plan view of the substrate member 10, the reinforcing portion 15 surrounds the light emitting element 30. The upper surface 15S of the reinforcing portion 15 is lower than the upper surface 30S of the light emitting element 30.

As described above, the at least one light emitting element 30 is protected by the reinforcing portion 15, so that even when the substrate member 10 as a whole is bent, the stress can be prevented from concentrating between the light emitting element 30 and the substrate member 10.

Also, the light emitting element 30 is disposed on the reinforcing portion 15 having high mechanical strength, so that at the time of mounting the light emitting element 30 on the reinforcing portion 15 by using an ultrasonic mounting method, defective mounting caused by, for example, inclination of the light emitting element 30 can be prevented.

Also, the distance D1 is smaller than the distance D2, so that the light emitted from the light emitting element 30 can be prevented from being blocked by the reinforcing portion 15.

Other Embodiments

The present invention is described with reference to the embodiment illustrated in the accompanying drawings. It should be understood, however, that the description and the drawings are intended as illustrative of the present invention, and the scope of the present invention is not limited to those described above. Various alternate embodiments, examples, and operational technologies will become apparent to one skilled in the art, from the description provided herein.

(1) In the above embodiment, the substrate member 10 includes four terminal portions 12 placed in the longitudinal direction, but is not limited thereto. The substrate member 10 at least includes two or more wiring portions 12. Also, a plurality of the wiring portions 12 may be placed in the lateral direction.

(2) In the above embodiment, the substrate member 10 includes two terminal portions 13 arranged at the both ends of the four the wiring portions 12, but is not limited thereto. The substrate member 10 may include three or more terminal portions 13. In this case, the light emitting element 30 and the sealing member 20 may be arranged bridging over three or more wiring portions 12.

(3) In the above embodiment, the substrate member 10 includes a terminal portions 13, but is not limited thereto. The substrate member 10 may include a wiring portion 12 having a connector to connect to an external wiring 13a alternative to the terminal portion 13.

(4) In the above embodiment, all the wiring portions 12 and the terminal portions 13 have the sealing members 20 and the light emitting elements 30 respectively arranged thereover, but are not limited thereto. The light emitting element 30 or/and the sealing member 20 may not be disposed on at least one wiring portion 12 or at least one terminal portion 13.

(5) In the above embodiment, one light emitting element 30 is connected to two wiring portions 12, but two or more light emitting elements 30 may be connected to two wiring portions 12.

(6) In the above embodiment, one sealing member 20 seals one light emitting element 30, but one sealing member 20 may seal two or more light emitting elements 30.

(7) In the above embodiment, a planar shape of the wiring portions 12 is shown in FIG. 1 for purposes of illustration and not limitation. The planar shape of the wiring portions 12 may be changed appropriately according to the size of the substrate member 10 and/or to the number of the light emitting element 30 to be used.

(8) In the above embodiment, a planar shape of the groove portion 14 is shown in FIG. 1 for purposes of illustration and not limitation. The planar shape of the groove portion 14 can be appropriately changed according to the planar shape of the wiring portions 12.

For example, the first groove part 141 and the second groove part 142 are illustrated substantially in parallel to each other, but is not limited thereto. The first groove part 141 may extend in a different direction from that of the second groove part 142.

Also, the first groove part 141 and the second groove part 142 respectively extend in the lateral direction and the third groove part 143 extends in the longitudinal direction, but is not limited thereto. The first groove part 141 and the second groove part 142 may respectively extend in the longitudinal direction and the third groove part 143 may extend in the lateral direction. The third groove part 143 is configured to extend in a direction which is different from that of the first groove part 141 and the second groove part 142.

(9) In the above embodiment, the groove portion 14 may have a shape which is a combination of linear groove parts, but is not limited thereto. At least a part of the groove portion 14 may be formed with a curved shape, a wavy shape, or the like.

(10) In the above embodiment, the light emitting elements 30 are mounted in a flip-chip manner, but is not limited thereto. For example, the light emitting elements 30 may be mounted by using die bonding or wire bonding technology. More specifically, the light emitting element 30 is die-bonded on the first section 151 of the reinforcing portion 15 and a wire connected to the light emitting element 30 is bridged over the third groove part 143 and bonded to the second section 152 of the reinforcing portion 15.

(11) In the above embodiment, the groove portion 14 may have a shape which is a combination of linear groove parts, but is not limited thereto. At least a part of the groove portions 14 may be formed with a curved shape, a wavy shape, or the like.

(12) In the above embodiment, the third groove portion 143 of the groove portion 14 is disposed at a center portion in the second direction of the light emitting device 100, but not limited thereto. The third groove parts 143 may be arranged at positions with a predetermined interval from the center of the light emitting device 100 in the lateral direction. In this case, the light emitting elements 30 are preferably disposed at a center portion in the lateral direction of the light emitting device 100.

(13) In the above embodiment, the light emitting device 100 includes six sets each including the sections of the groove portion 14, the sealing member 20, and the light emitting element 30, but are not limited thereto. The light emitting device 100 may include five or less sets or seven sets or more (for example, 10 sets, 50 sets, 100 sets, or 200 sets) of the parts of the groove portion 14, the sealing member 20, and the light emitting element 30. In this case, the interval between the sealing members 20 in the longitudinal direction can be, for example, 2 mm, 5 mm, 10 mm, 30 mm, 70 mm, or 100 mm.

(14) In the above embodiment, the first groove part 141 and the second groove part 142 are respectively defined in a linear shape, but are not limited thereto. The outer edges of the first groove part 141 and the second groove part 142 may be respectively rounded or slanted to the lateral direction. With this arrangement, the reflective layer 16 can be prevented from being damaged by a corner of the wiring portion 12.

(15) Each part of the wiring portion 12 may have at least one recessed shape in a plan view, for self-alignment of the light emitting elements 30. With this arrangement, preferable self-alignment of the light emitting elements 30 can be achieved.

(16) In the above embodiment, the plurality of light emitting elements 30 are connected in parallel, but the connection is not limited to this, an appropriate connection such as series connection, series-parallel connection, parallel-series connection, or the like, can be employed.

(17) The light emitting elements 30 may be so-called bare chips as described above, but chips in which a layer including a wavelength converting member, and/or a light-reflecting layer, etc. is previously disposed around such bare chips can also be used.

(18) In the above embodiment, the sealing members 20 are disposed only over the third groove parts 143 and spaced apart from the first groove parts 141 respectively, but the arrangement is not limited thereto. That is, each of the sealing members 20 may be disposed extending over the corresponding first groove part 141 and second groove part 142.

(19) In the above embodiment, the plurality of third groove parts 143 are arranged on a straight line in the longitudinal direction, but is not limited thereto. The plurality of third groove parts 143 may be arranged at different positions in the lateral direction.

(20) In the above embodiments, each of the light emitting elements 30 is connected over the reinforcing portion 15, but is not limited thereto. In a plan view of the substrate member 10, the reinforcing portion 15 is configured to surround the periphery of the light emitting element 30 and may be arranged spaced apart from the light emitting element 30. Even in such case, with the reinforcing portion 15, stress can be prevented from concentrating between the light emitting elements 30 and the substrate members 10. Also in such a case, the distance D1 between the upper surface 15S of the reinforcing portion 15 and the upper surface of the base member 11 is smaller than the distance D2 between the upper surface 30S of the light emitting element 30 and the upper surface of the base member 11.

As described above, it should be obvious that various other embodiments are possible without departing the spirit and scope of the present invention. Accordingly, the scope and spirit of the present invention should be limited only by the following claims.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
a substrate member including a flexible base member, a plurality of wiring portions disposed on the base member, at least one reinforcing portion each disposed on corresponding parts of the plurality of wiring portions, a groove portion formed by spacing the plurality of wiring portions apart from each other; and
at least one light emitting element disposed on the substrate member,
the groove portion including a first groove part extending in a first direction, at least one second groove part being spaced apart from corresponding one of at least one first groove part in the first direction and extending in a second direction, and at least one third groove part being joined to corresponding one of at least one first groove part and corresponding one of at least one second groove part respectively, and extending in a third direction which is different from the first direction and the second direction;
the at least one light emitting element disposed over the third groove part;
the at least one reinforcing portion disposed on a site for joining regions on respective plurality of wiring portions, the site for joining regions being provided for at least a first joining region where one of the at least one first groove part and one of the at least one third groove part join, and a second joining region where one of the at least one second groove part and the at least one third groove part join;
in a plan view of the substrate member, the at least one reinforcing portion surrounding a periphery of the at least one light emitting element; and
an upper surface of the at least one reinforcing portion located lower than an upper surface of the at least one light emitting element.

2. The light emitting device according to claim 1, wherein the at least one light emitting element is connected on the at least one reinforcing portion.

3. The light emitting device according to claim 1, wherein the at least one reinforcing portion is disposed on an upper surface of each of the plurality of wiring portions respectively.

4. The light emitting device according to claim 1, wherein the at least one reinforcing portion is electrically conductive and each electrically connected to corresponding one of the at least one light emitting element.

5. The light emitting device according to claim 1, wherein the first direction and the second direction are in parallel to each other.

6. The light emitting device according to claim 1, wherein the groove portion bends at the first joining region and the second joining region.

7. The light emitting device according to claim 1, wherein the at least one reinforcing portion has a higher hardness than the base member and the wiring portions.

8. The light emitting device according to claim 1, wherein an upper surface of the at least one reinforcing portion is positioned lower than an active layer of the at least one light emitting element.

9. The light emitting device according to claim 1, further comprising an underfill filled between the at least one light emitting element and the base member.

10. The light emitting device according to claim 5, wherein the third direction perpendicularly intersects the first direction and the second direction.

11. The light emitting device according to claim 10, wherein a width of both external ends of each of the at least one reinforcing portion in the third direction is larger than a width of the corresponding first groove part or second groove part in the third direction.

12. A light emitting device comprising:
a substrate member including a flexible base member, a plurality of wiring portions disposed on the base member, at least one reinforcing portion each disposed on corresponding parts of the plurality of wiring portions, a groove portion formed by spacing the plurality of wiring portions apart from each other; and
at least one light emitting element disposed on the substrate member;
the groove portion including a first groove part extending in a first direction, at least one second groove part being spaced apart from corresponding one of at least one first groove part in the first direction and extending in a second direction, and at least one third groove part being joined to corresponding one of at least one first groove part and corresponding one of at least one second groove part respectively, and extending in a third direction which is different from the first direction and the second direction;
the at least one reinforcing portion including a first section to which one of the at least one light emitting element is die-bonded, and a second section to which a wire which is connected to the at least one light emitting element is bonded across the third groove part;
the at least one reinforcing portion each being disposed on one of a plurality of sites for joining regions provided on the plurality of wiring portions, respectively, each site for joining regions being provided for at least a first joining region where one of the at least one first groove part and one of the at least one third groove part join, and a second joining region where one of the at least one second groove part and the third groove part join;
in a plan view of the substrate member, the at least one reinforcing portion surrounding a periphery of the at least one light emitting element, respectively; and
an upper surface of the at least one reinforcing portion being arranged lower than an upper surface of the corresponding light emitting element.

13. The light emitting device according to claim 12, wherein the at least one reinforcing portion is electrically conductive and electrically connected to the corresponding one of the at least one light emitting element.

14. The light emitting device according to claim 12, wherein the at least one light emitting element is disposed over the third groove part.

15. The light emitting device according to claim 12, wherein the at least one reinforcing portion is disposed on an upper surface of each of the plurality of wiring portions respectively.

16. The light emitting device according to claim 12, wherein the first direction and the second direction are in parallel to each other.

17. The light emitting device according to claim 12, wherein the at least one reinforcing portion has a higher hardness than the base member and the wiring portions.

18. The light emitting device according to claim 12, wherein an upper surface of the at least one reinforcing portion is positioned lower than an active layer of the at least one light emitting element.

19. The light emitting device according to claim 12, further comprising an underfill filled between the at least one light emitting element and the base member.

20. The light emitting device according to claim 16, wherein the third direction perpendicularly intersects the first direction and the second direction.

* * * * *